United States Patent [19]

Myers

[11] Patent Number: 5,114,358
[45] Date of Patent: May 19, 1992

[54] CHIP CARRIER SOCKET

[75] Inventor: Bruce B. Myers, South Bend, Ind.

[73] Assignee: Wells Electronics, Inc., South Bend, Ind.

[21] Appl. No.: 667,470

[22] Filed: Mar. 11, 1991

[51] Int. Cl.⁵ .............................................. H01R 11/22
[52] U.S. Cl. ...................................... 439/266; 439/70
[58] Field of Search ............... 439/264, 266, 269, 267, 439/68, 70, 71, 73, 330, 331

[56] References Cited

U.S. PATENT DOCUMENTS

| | | | |
|---|---|---|---|
| 4,491,377 | 1/1985 | Pfaff | 439/267 |
| 4,623,208 | 11/1986 | Kerul et al. | 439/266 |
| 4,691,975 | 9/1987 | Fukunaga et al. | 439/266 |
| 4,715,823 | 12/1987 | Ezure et al. | 439/70 X |
| 4,799,897 | 1/1989 | Mogi et al. | 439/266 X |
| 4,801,273 | 1/1989 | Ikeya et al. | 439/70 X |
| 5,009,609 | 4/1991 | Matsuoka et al. | 439/331 X |

Primary Examiner—Larry I. Schwartz
Assistant Examiner—Khiem Nguyen
Attorney, Agent, or Firm—James D. Hall

[57] ABSTRACT

A chip carrier socket which includes conductive contacts each having an outwardly extending upwardly directed cantilevered projection which engages a moveable top forming a part of the socket. The top, when moved downwardly, relative to the base of the socket which carries the contacts forces the contacts outwardly to allow the insertion or removal of the chip carrier. The top includes a multiple-angled camming surface which engages the upwardly extending cantilevered projection of each contact to apply a more generally even force against the contact during depression or downward movement of the top.

11 Claims, 6 Drawing Sheets

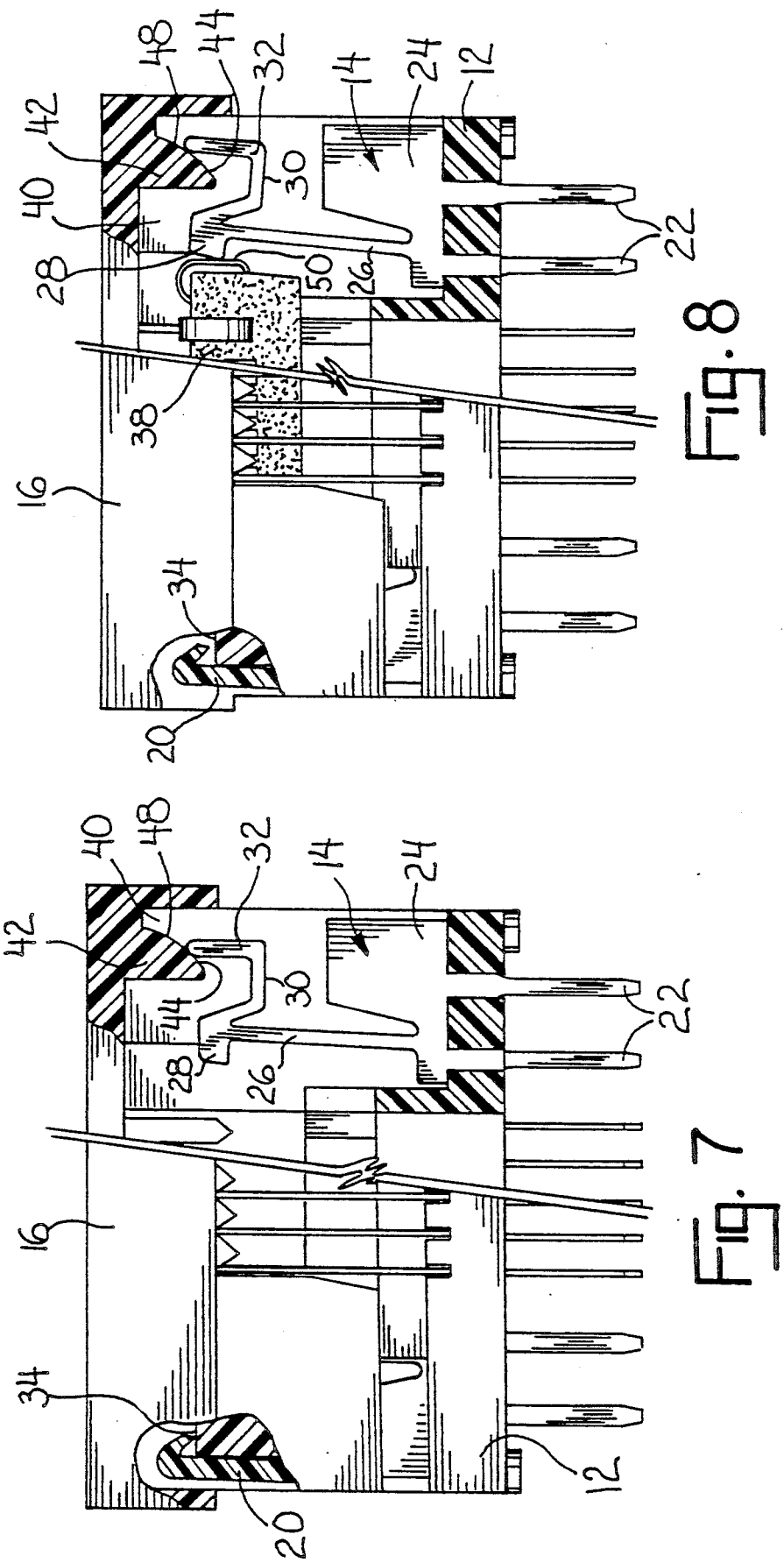

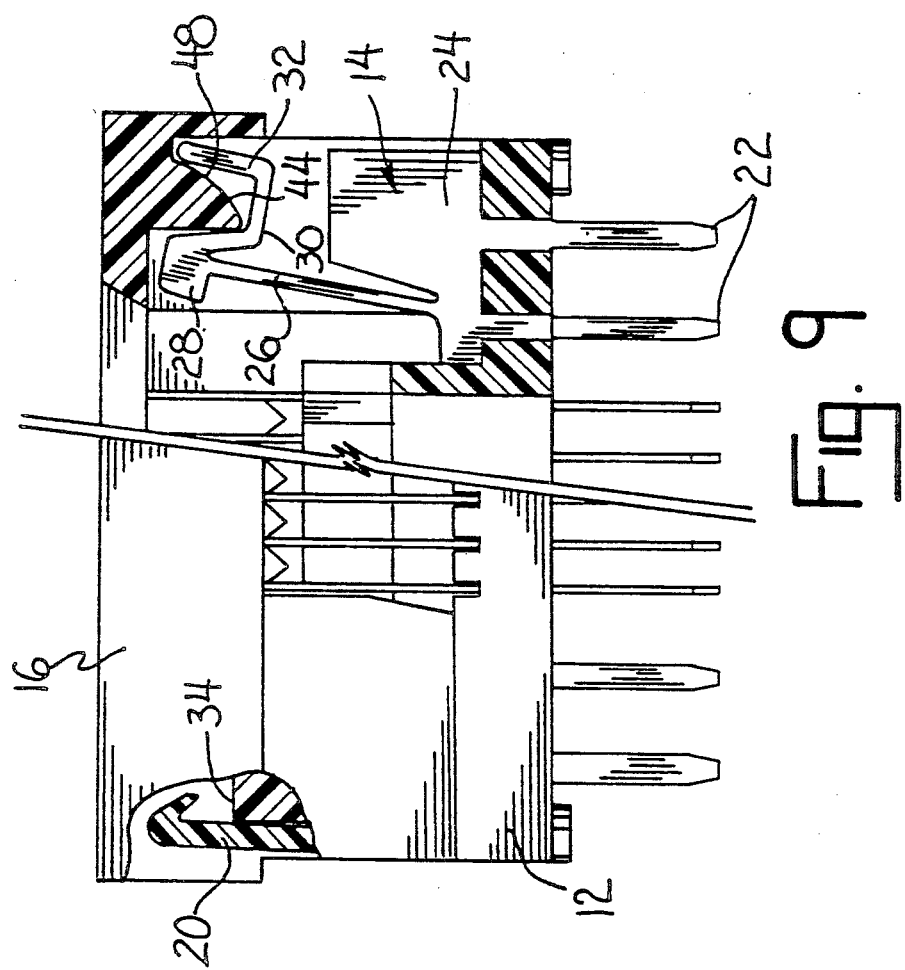

CHIP CARRIER SOCKET

FIELD OF THE INVENTION

This invention relates to a socket for accommodating chip carriers.

BACKGROUND OF THE INVENTION

As is now common, integrated circuits are being formed into increasingly smaller, miniaturized form known as "chips" which are normally mounted to a carrier. Sockets are electrically connected devices which accommodate chip carriers for the purpose of either testing the chips or mounting the carriers and chips to an appropriate circuit board. Examples of such socket devices are found in U.S. Pat. Nos. 4,491,377; 4,623,208; and 4,715,823. In U.S. Pat. No. 4,491.377 the contacts which engage the chip carrier within the socket are formed with internally bevelled surfaces which engage a correspondingly bevelled top. When the top is depressed, the contacts by virtue of their engagement with the top at their internal edges, are forced outwardly to allow the insertion or removal of the chip carrier. Sockets of this nature are inherently enclosed which reduces air circulation through the socket and about the chip carrier, thereby tending to cause overheating of the chip. In U.S. Pat. No. 4,623,208 each contact of the socket is of cantilevered form having a platform or arm which extends outwardly and which engages the top. In a socket of this nature, there is more openness between the top and the base of the socket to allow adequate ventilation of the chip carrier. But due to the configuration of the contacts, additional downward force is generally required to be applied to the top in order to spread the contacts to allow the insertion or removal of the chip carrier. In U.S. Pat. No. 4,715,823 each contact is provided with a more circular or return bent configuration while still of cantilevered form which reduces the amount of force required to be applied to the top to spread the contacts. Nevertheless, the design of each contact is extremely critical which results in an overly complicated socket design.

In the following described invention, each contact of the socket is a simplified design with the top of the socket being constructed to apply at first a greater vertical force and later a greater lateral force as the contact is bent outwardly to accommodate the insertion or removal of the chip carrier.

SUMMARY OF THE INVENTION

In the socket of this invention, each contact is provided with an upwardly projecting, outwardly extending arm which engage multiple-angled camming surface of the top. This multiple-angled camming surface causes a variation in force applied to each contact as the top is depressed, resulting in a more generally constant resultant vertical force between the top and the contact as the contact is bent outwardly.

Accordingly, it is an object of this invention to provide a socket which is for a chip carrier and which is of simplified operation.

Still another object of this invention is to provide a socket which is for a chip carrier and which may be actuated with a minimum of applied force to the top in order to spread or open the contacts of the socket.

And still another object of this invention is to provide a socket which is for a chip carrier and in which a more generally constant vertical force is applied by the top to the contacts during actuation of the socket.

Other objects of this invention will become apparent upon a reading of the following description.

BRIEF DESCRIPTION OF THE DRAWINGS

A preferred embodiment has been chosen for purposes of illustration wherein:

FIG. 7 is a side view of the socket with portions broken away to illustrate the relative positions of the base member, top, and contacts with the top in its uppermost operative position.

FIG. 8 is a side view of the socket with portions broken away to illustrate the relative positions of the base member, top, and contacts with the top in an intermediate operative position and the contacts engaging a chip carrier.

FIG. 9 is a side view of the socket with portions broken away for purposes of showing the relative positions of the base member, top, and contacts with the top in its lowermost operative position.

DESCRIPTION OF THE PREFERRED EMBODIMENT

Figure 1:
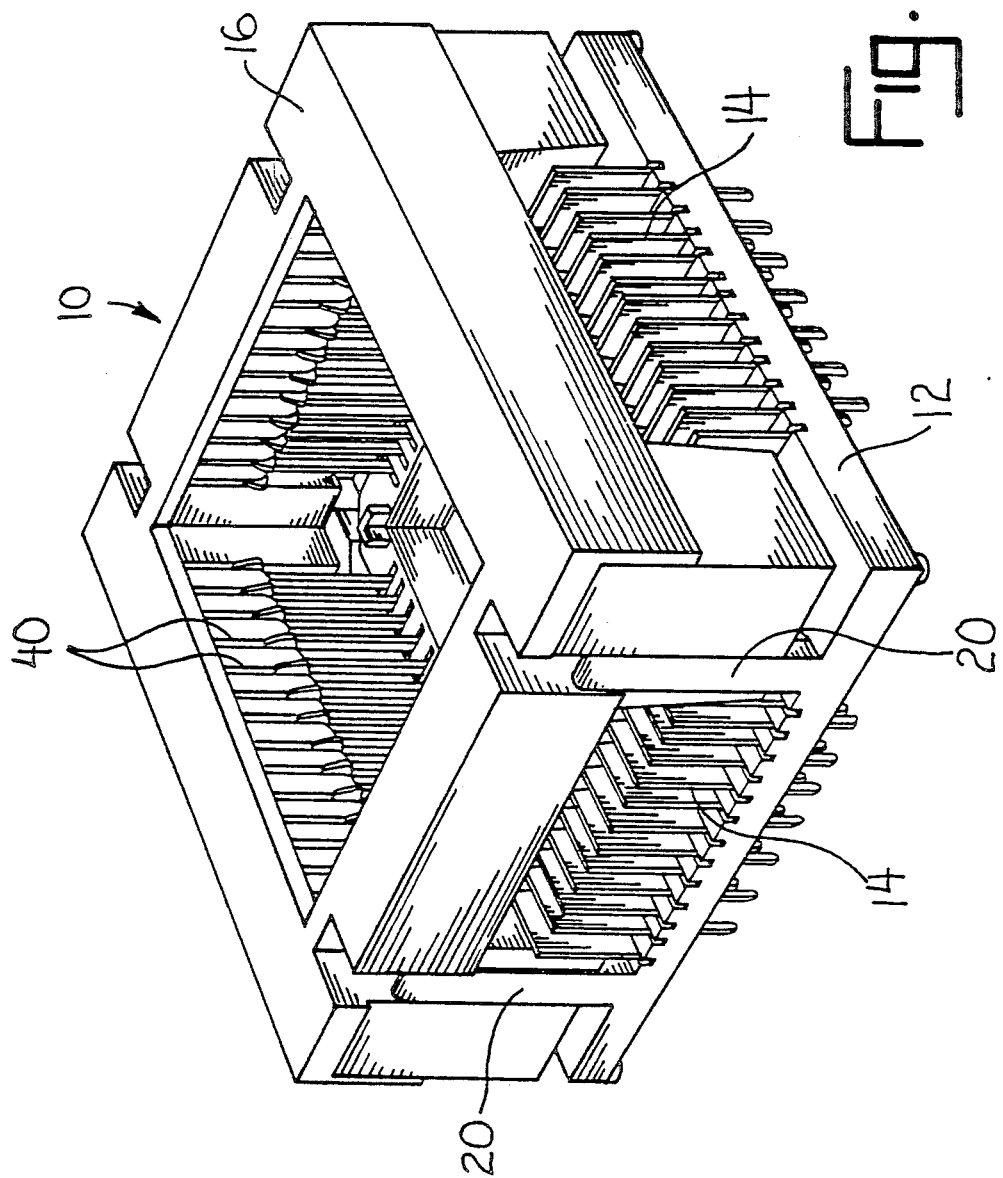
FIG. 1 is a perspective view of the socket.
Figure 2:
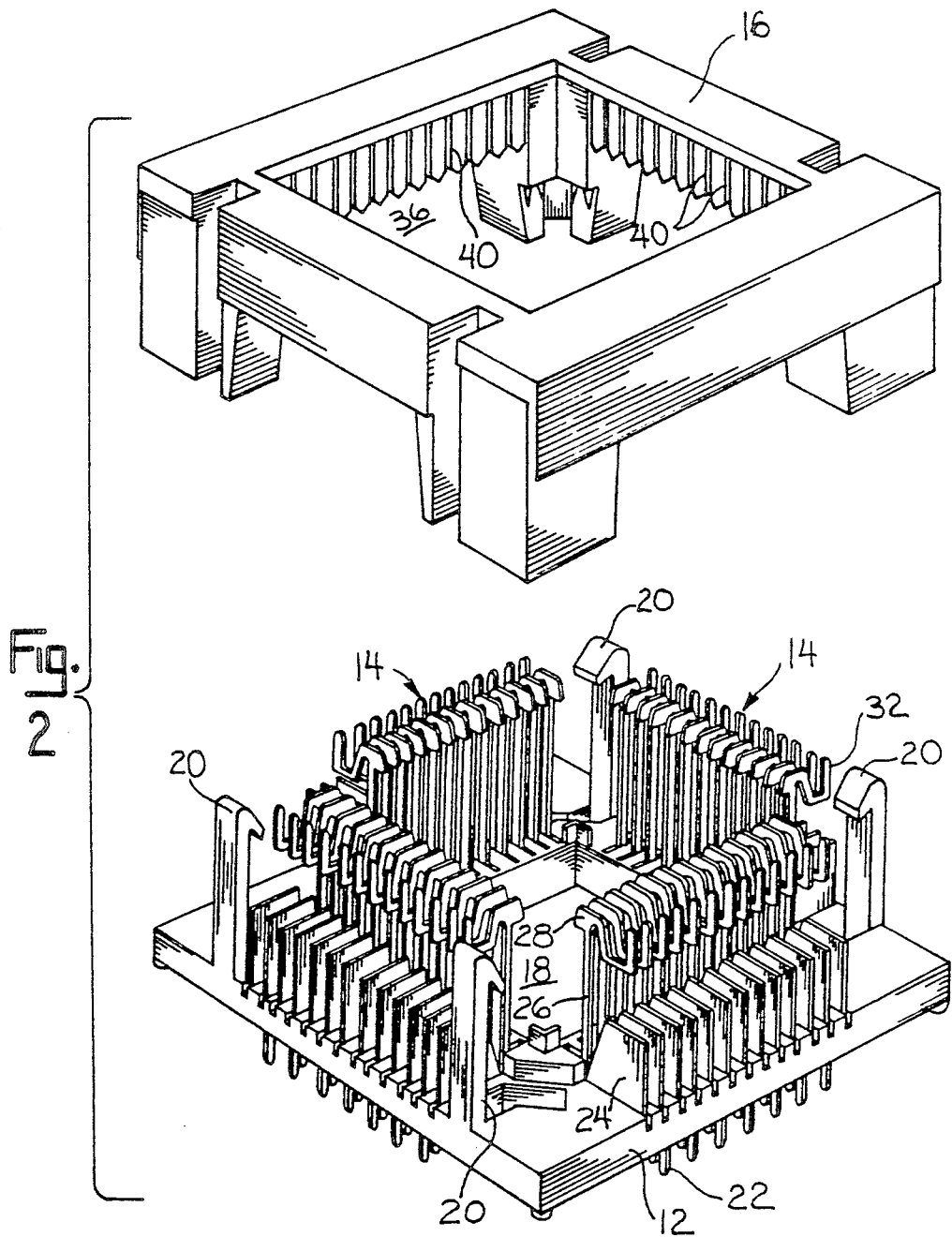
FIG. 2 is an exploded view of the socket components.
Figure 3:
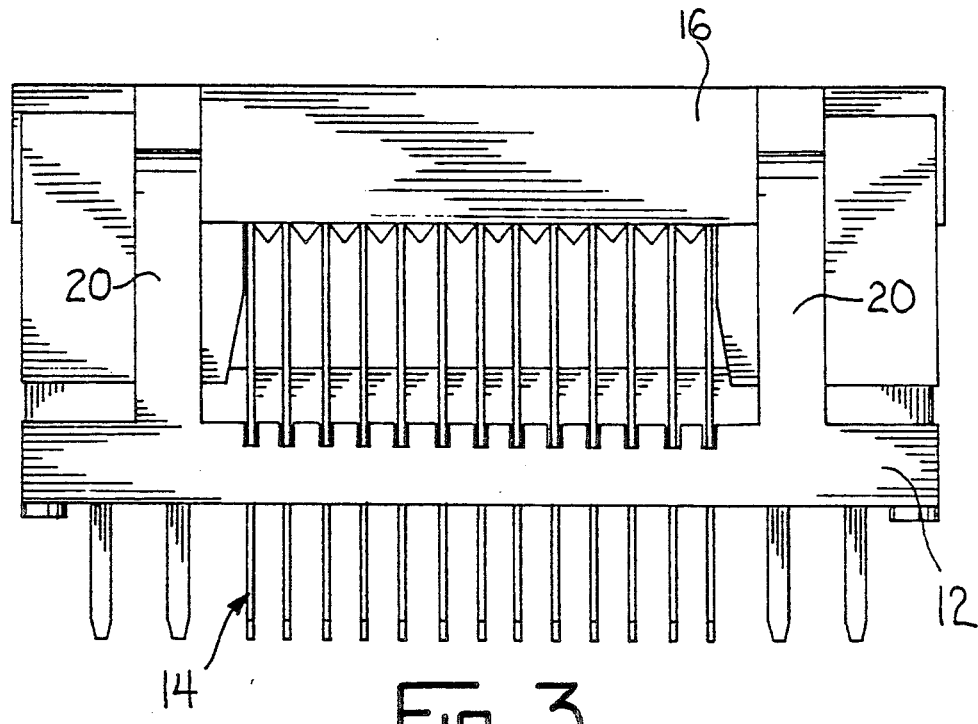
FIG. 3 is a side view of the socket as seen from the left as viewed in FIG. 1.
Figure 4:
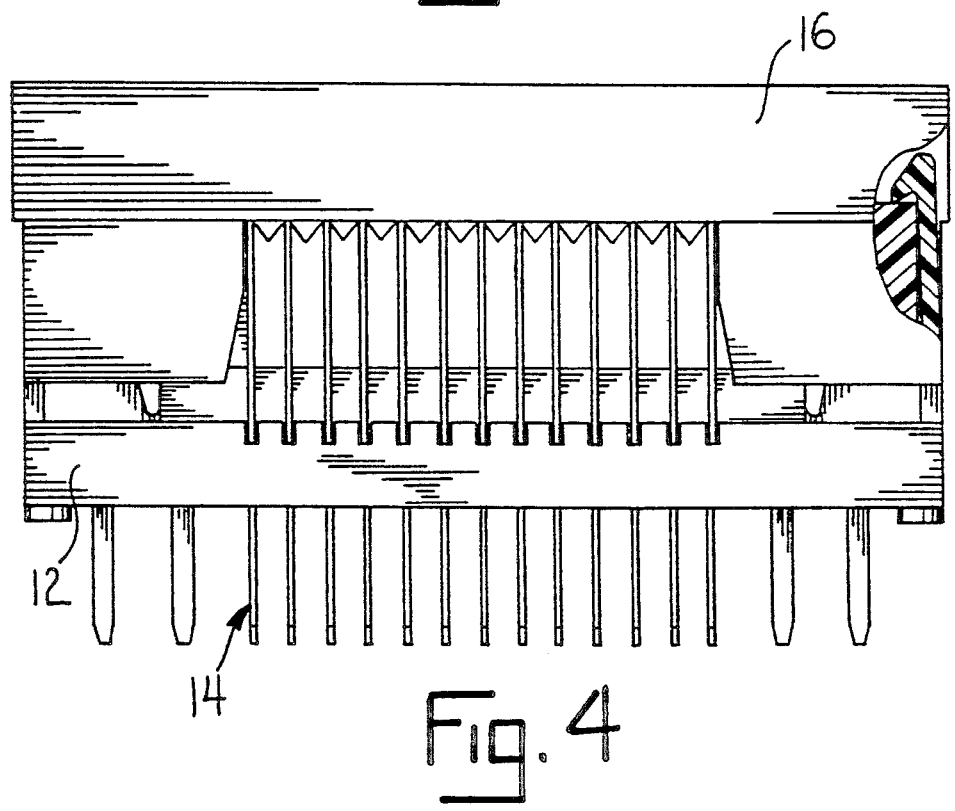
FIG. 4 is a side view of the socket as seen from the right of FIG. 1 with portions broken away for purposes of illustration to show the latching mechanism between the base member and top of the socket.
Figure 5:
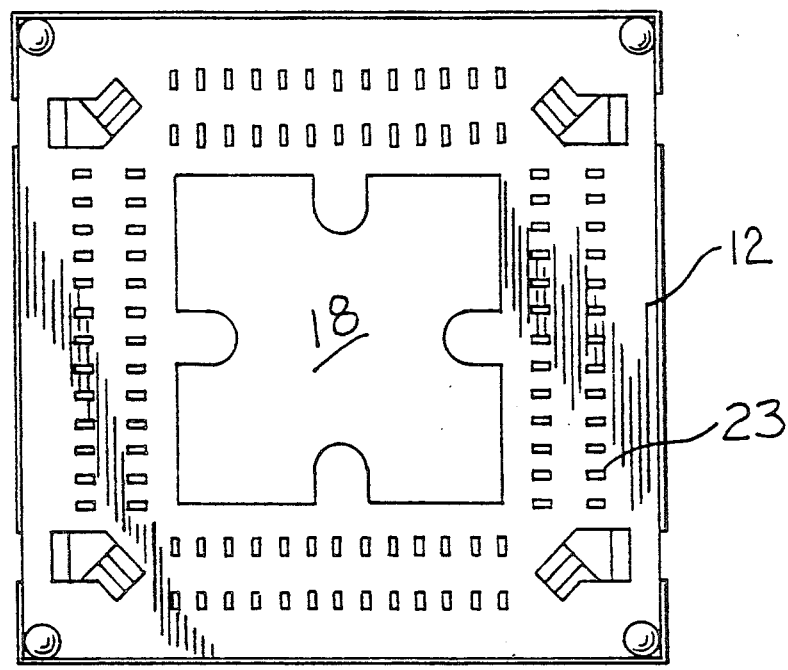
FIG. 5 is a bottom view of the socket.
Figure 6:
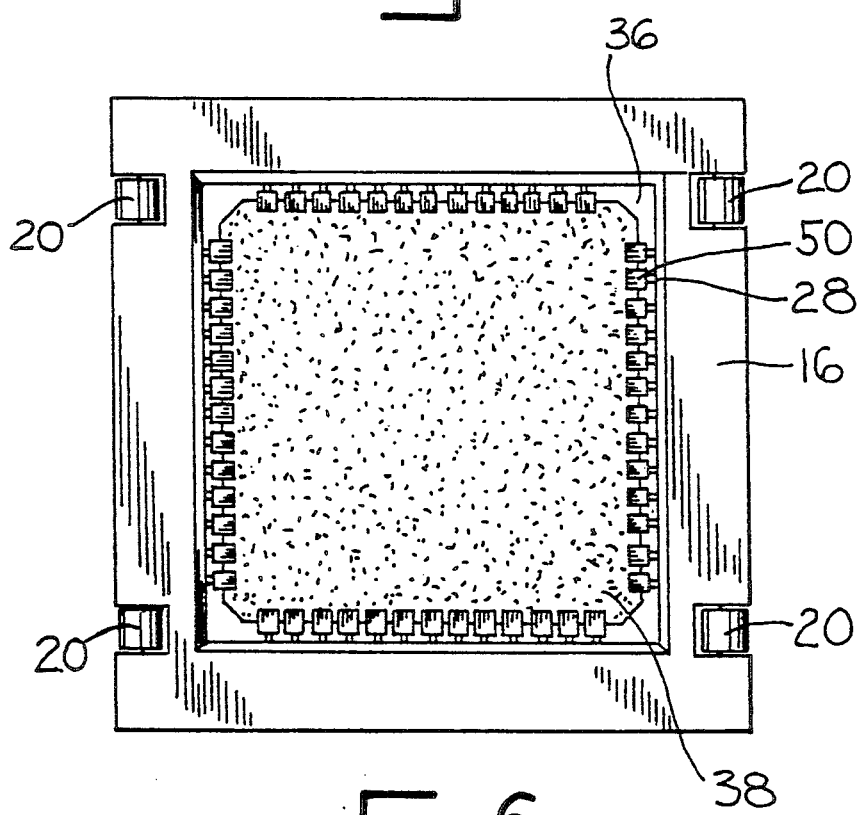
FIG. 6 is a top view of the socket showing a chip carrier seated within the socket.

Socket 10 illustrated in the figures includes a base member 12, a plurality of contacts 14, and a top 16. Base member 12 has a central opening 18 and includes two pairs of opposed finger latches 20.

Each contact 14 includes leads 22, a base 24, a stem 26, a laterally extending tip 28 and an arm 30 which extends laterally opposite of tip 28 in a U-shaped configuration, terminating in an upright projection 32. Stem 26 of each contact 14 is of a straight, generally vertical form. Top 16 of socket 10 includes shoulder parts 34 and has a central opening 36 to allow for the insertion of an integrated circuit or chip carrier 38 into the socket. Top 16 has a plurality of grooves 40 formed along each of its sides at its upper margin. Within each groove is an abutment part 42 having an outer camming surface formed by contiguous, bevelled surface components 44 and 48.

Contacts 14 are carried by base member 12 with their leads 22 extending through openings or bores 23 in the base. Top 16 is positioned over the base member with projections 32 of the contacts extending into top grooves 40 into engagement with abutment parts 42 of the top. Latches 20 of the base member 12 fit over shoulders 34 of top 16 to secure the top and base member together with the top being urged by the engaging contacts 14 into its uppermost operative position illustrated in FIG. 7. When in this position, the top makes slight positive engagement at the lower surface component 44 of each abutment part 42 with projection 32 of the underlying contact.

As top 16 is depressed or moved downwardly relative to base member 12 to spread contacts 14 for the insertion of chip carrier 38, contact projections 32 slide along and are cammed outwardly, first across lower surface components 44 and then along upper surface components 48 of the top abutment parts 42 until the top is in its lowermost operative position as illustrated in FIG. 9. During the movement of top 16 between its uppermost operative position shown in FIG. 7 and its lowermost operative position shown in FIG. 9, the top initially exerts a greater vertical force upon contacts 14 at projections 32 during engagement of the projections with lower surface components 44 of the top abutment parts 42, and then as the contacts are shifted or bent outwardly, the contact projections 32 engage upper surface components 48 of the top abutment parts 42 which are inclined at a greater angle relative to the horizontal than lower surface components 44. The greater the angle of the abutment parts such as at upper surface components 48, the less amount of direct vertical force and a greater lateral force will be applied to each contact at its projection 32. Variation in the amount of downward force required in which to shift or bend each contact outwardly is accommodated by variations in the camming surfaces of the top so as to produce a more generally constant or uniform vertical pressure which is applied by the top to the contacts.

In FIG. 8, socket 10 is shown with chip carrier 38 seated within the socket and with contacts 14 engaging leads 50 of the carrier. To remove carrier 38 from socket 10, top 16 need only be depressed from its intermediate position shown in FIG. 8 to its lowermost operative position shown in FIG. 9, thereby disengaging contacts 14 from leads 50 of the chip carrier. The carrier may now be removed from the socket without any detrimental wiping action between the carrier leads and the socket contacts. By providing a variable camming surface for the socket top, a variable bending moment or force is applied to each contact by the top to accommodate the variable force required to move or shift the contact, resulting in a more generally constant or uniform vertical force being applied between the top and the contact.

It is to be understood the invention is not to be limited to the details above given, but may be modified within the scope of the following claims.

What I claim is:

1. A socket for a chip carrier having conductive parts, said socket comprising a base member, a plurality of conductive resilient contacts for engaging said conductive parts on said carrier, each contact anchored in said base member and including an upwardly extending part, said contacts positioned in an opposing relationship and constituting clamping means for engaging said carrier at its said conductive parts within said socket, each contact including a cantilevered part projecting from its upwardly extending part outwardly relative to said base member, and a moveable top overlying said base member, said top including abutment means engaging each contact cantilevered part for moving said contacts in an outward direction relative to the base member upon movement of the top in a substantially straight line downward direction between an uppermost position and a lowermost position to cause the contacts to be flexed to allow insertion of said carrier into the socket, said top abutment means including camming surface means having variable angular relationships, said camming surface means for applying a variable downward force upon the cantilevered part of each contact wherein said force applied by said top in a vertical component remains generally constant as the top is shifted from its uppermost position toward its lowermost position.

2. The socket of claim 1 wherein said base member has a central opening therein having at least two sides, said contacts being positioned at each side of said member central opening.

3. The socket of claim 1 wherein each contact upwardly extending part is of a generally straight vertical orientation.

4. The socket of claim 1 or 3 wherein said camming surface means includes a first surface component located innermost relative to said base member and a second surface component located outwardly of said first surface component, said first surface component being angled at a lesser angle than said second surface component is angled relative to the horizontal wherein as said top is shifted from its uppermost position into its lowermost position each contact cantilevered part initially engages a said first surface component and thereafter a said second surface component of the camming surface means.

5. The socket of claim 1 wherein each contact cantilevered part includes an upward projection, said camming surface means engaging each cantilevered part upward projection.

6. The socket of claim 5 wherein each contact cantilevered part is U-shaped and terminates in a said upward projection, said top abutment means extending into each U-shaped cantilevered part engaging with said upward projection thereof.

7. The socket of claim 5 wherein each cantilevered part upward projection is rounded at its uppermost part.

8. A socket for a chip carrier having conductive parts, said socket comprising a base member, a plurality of conductive resilient contacts for engaging said conductive parts on said carrier, each contact anchored in said base member and including an upwardly extending part, said contacts positioned in an opposing relationship and constituting clamping means for engaging said carrier at its said conductive parts within said socket, each contact including a cantilevered part projecting from its upwardly extending part outwardly relative to said base member, and a moveable top overlying said base member, said top including abutment means engaging each contact cantilevered part for moving said contacts in an outward direction relative to the base member upon movement of the top in a substantially straight line downward direction between an uppermost position and a lowermost position to cause the contacts to be flexed to allow insertion of said carrier into the socket, said top abutment means including camming surface means having variable angular relationships, said camming surface means for applying a variable downward force upon the cantilevered part of each contact, camming surface means including a first surface component located innermost relative to said base member and a second surface component located outwardly of said first surface component, said first surface component being angled at a lesser angle than said second surface component is angled relative to the horizontal wherein as said top is shifted from its uppermost position into its lowermost position each contact cantilevered part initially engages a said first surface component and thereafter a said second surface component of the abutment means camming surface.

9. The socket of claim 8 wherein each contact cantilevered part includes an upward projection, said camming surface means engaging each cantilevered part upward projection.

10. The socket of claim 9 wherein each contact cantilevered part is U-shaped and terminates in a said upward projection, said top abutment means extending into each U-shaped cantilevered part engaging with said upward projection thereof.

11. The socket of claim 9 wherein each cantilevered part upward projection is rounded at its uppermost part.

* * * * *